United States Patent
Tchoul et al.

(10) Patent No.: US 10,221,353 B2
(45) Date of Patent: Mar. 5, 2019

(54) WAVELENGTH CONVERTING COMPOSITIONS, WAVELENGTH CONVERTERS AND DEVICES INCLUDING THE SAME

(71) Applicant: OSRAM Opto Semiconductors GmbH, Regensburg (DE)

(72) Inventors: Maxim N. Tchoul, Winchester, MA (US); David W. Johnston, Kensington, NH (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 5 days.

(21) Appl. No.: 15/116,414

(22) PCT Filed: Mar. 30, 2015

(86) PCT No.: PCT/US2015/023265
§ 371 (c)(1),
(2) Date: Aug. 3, 2016

(87) PCT Pub. No.: WO2015/153415
PCT Pub. Date: Oct. 8, 2015

(65) Prior Publication Data
US 2016/0347997 A1    Dec. 1, 2016

Related U.S. Application Data (60) Provisional application No. 61/972,915, filed on Mar. 31, 2014.

(51) Int. Cl.
| | |
|---|---|
| C09K 11/02 | (2006.01) |
| C08G 77/52 | (2006.01) |
| C08L 83/14 | (2006.01) |
| H01L 33/50 | (2010.01) |
| C09K 11/08 | (2006.01) |
| C09K 11/77 | (2006.01) |
| C08K 3/22 | (2006.01) |
| C08K 3/34 | (2006.01) |
| H01L 33/56 | (2010.01) |

(52) U.S. Cl.
CPC ............ *C09K 11/025* (2013.01); *C08G 77/52* (2013.01); *C08K 3/22* (2013.01); *C08K 3/34* (2013.01); *C08L 83/14* (2013.01); *C09K 11/02* (2013.01); *C09K 11/0883* (2013.01); *C09K 11/7734* (2013.01); *C09K 11/7774* (2013.01); *C09K 11/7792* (2013.01); *H01L 33/501* (2013.01); *H01L 33/502* (2013.01); *H01L 33/56* (2013.01); *C08K 2003/221* (2013.01); *C08K 2003/2213* (2013.01); *C08K 2003/2227* (2013.01); *H01L 2933/005* (2013.01); *H01L 2933/0041* (2013.01)

(58) Field of Classification Search
CPC ...................................................... C08G 77/52
See application file for complete search history.

(56) References Cited

U.S. PATENT DOCUMENTS

| | | | |
|---|---|---|---|
| 6,451,954 B1 * | 9/2002 | Singh | C08G 77/52 524/431 |
| 2005/0213926 A1 | 9/2005 | Tabei et al. | |
| 2006/0105483 A1 | 5/2006 | Leatherdale et al. | |
| 2007/0287208 A1 | 12/2007 | Thompson et al. | |
| 2008/0182087 A1 | 7/2008 | Kato et al. | |
| 2011/0278640 A1 | 11/2011 | Motallebi et al. | |
| 2012/0126282 A1 * | 5/2012 | Tanikawa | H01L 23/296 257/100 |
| 2013/0161849 A1 * | 6/2013 | Wataya | C09K 11/645 264/21 |

OTHER PUBLICATIONS

Watanabe et al., "Polysilphenylenesiloxane Resist With Three-Dimensional Structure", Polymers for Microelectronics, Nov. 23, 1993, American Chemical Society, Washington, D.C., vol. 537, (pp. 194-209).

* cited by examiner

*Primary Examiner* — Kuo Liang Peng
(74) *Attorney, Agent, or Firm* — Slater Matsil, LLP (57) ABSTRACT

Disclosed herein are wavelength converting compositions, wavelength converters and light sources including the same. The wavelength converting compositions include at least one poly(silphenylene-siloxane) gel matrix that contains at least one wavelength conversion material, such as one or more phosphors in powdered and/or particulate form. Methods of making such compositions and converters are also disclosed. Wavelength converted light sources such as wavelength converted light emitting diode packages are also disclosed. The poly(silphenylene-siloxane) gel matrix exhibits relatively high thermal stability, as well as desirable optical properties.

26 Claims, 6 Drawing Sheets

WAVELENGTH CONVERTING COMPOSITIONS, WAVELENGTH CONVERTERS AND DEVICES INCLUDING THE SAME

CROSS REFERENCES TO RELATED APPLICATIONS

This application claims the benefit of U.S. Provisional Application No. 61/972,915, filed Mar. 31, 2014, which is hereby incorporated herein by reference.

TECHNICAL FIELD

The present disclosure generally relates to wavelength converting compositions including a polymer matrix containing particulates of a wavelength converting material. More particularly, the present disclosure relates to wavelength converting compositions including at least one poly(silphenylene-siloxane) gel.

BACKGROUND

Light emitting diodes (LEDs) typically generate a substantially monochromatic light in a specific region of the electromagnetic spectrum. The color of the light output from the LED depends on the material composition of the LED, e.g., InGaN LEDs may produce a blue light whereas AlGaInP LEDs may produce a red light. When it is desired to construct an LED light source that produces a color different from the output color of the LED, it is known to use a wavelength converter to convert all or a portion of the light output from the LED having a first wavelength or wavelength range (the "primary light" or "excitation light") to light having a second wavelength or wavelength range (the "secondary light" or "emission light").

Many wavelength converters include a wavelength converting composition that includes a polymeric matrix that contains a dispersion of a wavelength conversion material, which generally functions to convert primary light to secondary light via photoluminescence. Typically, a wavelength-conversion material absorbs relatively high energy primary light, which can excite the wavelength-conversion material to a higher energy state. When the wavelength conversion material returns to a lower energy state it emits secondary light, generally of a different wavelength/wavelength range than the primary light. The wavelength/wavelength range of the secondary light depends on the type of wavelength-conversion material used. Secondary light of a desired wavelength/wavelength range may therefore be attained by proper selection of wavelength conversion material. This process may be understood as "wavelength down conversion." An LED that is combined with a wavelength converter to produce secondary light may be described as a "wavelength converted LED."

Conversion of primary light to secondary light also results in the conversion of some portion of incident primary light to heat (Stokes heat). Unless it is dissipated in some manner (e.g., via a heat sink), this heat can accumulate in the wavelength converter. This can cause problems when the wavelength converter is used in wavelength converted LED package. More specifically, heat produced by the wavelength conversion process may degrade the mechanical and optical properties of the wavelength converter, particularly if the converter includes a polymeric matrix. Indeed, the Stokes heat may degrade the properties of the polymeric matrix, potentially leading to premature degradation of the LED package in which the wavelength converter is incorporated. This is particularly true when the polymeric matrix includes an epoxy or silicone based polymer, as such polymers may exhibit significant thermo-oxidative degradation at temperatures exceeding about 90 to about 200° C., depending on the material used.

To address this issue, a lighting designer may limit the amount of primary light that is output by an LED, e.g., by limiting the amount of current applied to an LED package. Controlling the amount of primary light emitted by the package can in turn control the amount of Stokes heat generated during the wavelength conversion process. Although effective, this method artificially limits the amount of primary light that may be output by a LED package, which may be undesirable.

BRIEF DESCRIPTION OF THE DRAWINGS

Reference is now made to the following detailed description which should be read in conjunction with the following figures, wherein like numerals represent like parts.

DETAILED DESCRIPTION

As used herein, the terms "substantially" and "about" when used in connection with an amount or range mean plus or minus 5% of the stated amount or the endpoints of the stated range.

As used herein, the term "optically transparent" when used in connection with a material (e.g., a matrix or a filler), means that the material transmits greater than or equal to about 80% of incident light, such as greater than or equal to about 90%, greater than or equal to about 95%, or even greater than or equal to about 99% of incident light. The incident light may be of a specified wavelength or wavelength range (e.g., ultraviolet, visible, infrared, etc.), or may span multiple wavelength ranges. Without limitation, materials described herein as being optically transparent preferably transmit greater than or equal to about 95% (e.g., greater than or equal to about 99%) of incident light in at least one visible region of the electromagnetic spectrum.

As used herein, the terms, "light emitting diode," "LED," and "LED light source" are used interchangeably, and refer to any light emitting diode or other type of carrier injection/junction-based system that is capable of generating radiation in response to an electrical signal, e.g., semiconductor lasers and organic light emitting diodes (OLEDs).

From time to time one or more aspects of the present disclosure may be described using ranges. In such instances it should be understood that the indicated ranges are exemplary only unless expressly indicated otherwise. Moreover, the indicated ranges should be understood to include all of the individual values of falling within the indicated range, as though such values were expressly recited. Moreover, the ranges should be understood to encompass sub-ranges within the indicated range, as though such sub-ranges were expressly recited. By way of example, a range of 1 to 10 should be understood to include 2, 3, 4 . . . etc., as well as the range of 2 to 10, 3 to 10, 2 to 8, etc., as though such values and ranges were expressly recited.

As briefly described in the background, a variety of wavelength converters used in phosphor converted LEDs include a wavelength converting composition that itself includes a polymeric matrix that contains a wavelength converting material. Although such wavelength converting compositions can be useful, they often utilize silicone or epoxy polymeric matrices that can be degraded by exposure to high temperatures (e.g., above about 90 to 200° C.) during the operation of the LED. It may therefore be necessary to artificially limit the light output of an LED to ensure that the temperature of the wavelength converter (and, more particularly, the polymeric matrix of the wavelength converting composition) stays within tolerable limits. Failure to maintain the temperature of the wavelength converter within the tolerance of the polymeric matrix may lead to thermal and/or oxidative breakdown of the matrix, potentially leading to premature failure of the LED.

One aspect of the present disclosure therefore relates to wavelength converting compositions that include a polymeric matrix including at least one poly(silphenylene-siloxane) gel (also known as "silphenylenes" or "silarene-siloxanes."). As will be explained in detail below, the poly(silphenylene-siloxane) gels described herein may exhibit relatively high thermal stability compared to some optical grade epoxies and/or silicones, while maintaining the same or similar optical performance. This combination of properties makes the poly(silphenylene-siloxane) gels described herein particularly attractive for use as a polymeric matrix of a wavelength converter, as they may enable the production of wavelength converters with relatively high thermal stability, as well as desirable optical properties. This in turn may enable the production of wavelength converted lighting devices (e.g., LEDs) wherein the light output from the device (LED) may not be limited, or may be limited to a lesser extent than what may be required when epoxy and silicone based polymeric matrices are used.

Without wishing to be bound by theory, it is believed that the relatively high thermal stability exhibited by the poly(silphenylene-siloxane) gels described herein is due to the relatively rigid structure of their polymer backbone, which may make the usual decomposition mechanism for siloxanes (e.g., depolymerization of the siloxane chain) thermodynamically unfavorable. Indeed in contrast to silicones, it is believed that the poly(silphenylene-siloxanes) gels described herein may decompose primarily by homolytic cleavage of Si—O and Si—C bonds, which requires significantly more energy than depolymerization of the siloxane chain. This makes the poly(silphenylene-siloxanes) described herein an attractive option for use as the polymeric matrix of a wavelength converting composition of a wavelength converter (e.g., for use in a lighting device such as an LED), particularly as they may exhibit the same or similar optical properties as optical grade silicones and epoxies, as well as enhanced thermal stability.

Accordingly, one aspect of the present disclosure relates to wavelength converting compositions that include:
(a) a polymeric matrix comprising at least one poly(silphenylene-siloxane) gel;
(b) at least wavelength converting material contained in said polymeric matrix; and
(c) optionally at least one optically transparent inorganic material encapsulated in said polymeric matrix.

The relative amount of components a), b), and c) may vary widely depending on the application and desired properties. For example, the amount of component b) (wavelength converting material) may impact the amount of primary light that is converted to secondary light by the composition. It may also affect the viscosity of the composition, as well as its thermal conductivity. In some embodiments, the amount of component a) in the wavelength converting structures described herein may range from greater than 0 to less than 100 weight %, such as about 20 to about 99 weight %, about 40 to about 99 weight %, or even about 50 to about 99 weight %. Without limitation, the amount of component a) in the wavelength converting structure is preferably within the range of about 40 to about 60 weight %.

In some embodiments, the amount of component b) in the wavelength converting structures described herein may range from greater than 0 to about 75 weight %, such as greater than 0 to about 60 weight %, or even about 1 to about 50 weight %. Without limitation, the amount of component b) is preferably within the range of about 25 to about 50 weight %.

The amount of optional component c) in the wavelength converting structures may range from 0 to about 50 weight %. In some embodiments, the amount of component c) ranges from greater than 0 to about 50 weight %, such as about 10 to about 50 weight %, or even about 20 to about 50 weight %.

A wide variety of poly(silphenylene-siloxane) gels are contemplated for use as component a) above. As non-limiting examples of suitable poly(silphenylene-siloxane) gels that may be used, reference is made to poly(silphenylene-siloxane) gels of formula (I) below wherein the different repeating monomer units are delimited by square brackets [ ]:

Formula (I)

in which:

functional groups $R_1$ to $R_7$ may be the same or different and may be chosen from hydrogen atoms, substituted or unsubstituted, saturated or unsaturated, linear, branched or cyclic aliphatic hydrocarbon groups, aromatic hydrocarbon groups, fluorocarbon groups and combinations thereof;

$X_2$ is a group derived from group $A_2$ of a corresponding poly(silphenylene-siloxane) copolymer (described below), which may link a first copolymer chain to another copolymer chain that is of the same or similar structure as shown in formula (I) or which corresponds to a curing agent of the structure of formula (III) below. For example, $X_2$ may be an alkylene linking group (e.g., $CH_2CH_2$, etc.) if the gel is formed by curing a corresponding copolymer via hydrosilation or an oxygen atom, if the gel is formed by curing a corresponding copolymer via condensation and $A_2$ is an oxygen containing linking group such as an oxygen, alkoxy, alkenoxy, or an aryloxy, non-limiting examples of which include methoxy, ethoxy, and phenoxy groups;

a is an integer ranging from 1 to 3;

n and m represent relative fractions of the different monomer units in the copolymer gel, where $0 \leq n \leq 1$, $0 \leq m \leq 1$, and n+m equals 1; and the sites denoted by an ellipsis " . . . " represent a continuation of the polymer with the same or similar monomer units as depicted in Formula (I), optionally by virtue of one or more chain extension and/or linking groups which may be derived from groups $A_1$ and/or $A_3$ of a corresponding copolymer resin (discussed below), and/or which may be developed by curing the corresponding copolymer resin, e.g., via hydrosilation curing, condensation curing, or some other curing mechanism optionally with the use of an appropriate curing agent and further optionally in the presence of a catalyst, as will be described later.

In any case, the gels of formula (I) may be understood to be crosslinked via one or more of the " . . . " sites and/or via $X_2$.

As non-limiting examples of saturated aliphatic hydrocarbon groups that may be suitable for use as one or more of $R_1$ to $R_7$, mention is made of substituted or unsubstituted, linear, branched, or cyclic alkyl groups of the general formula $C_xH_{(2x+1)}$, where x ranges from 1 to 20, such as 1 to 10, or even 1 to 3. Such groups include but are not limited to substituted or unsubstituted methyl, ethyl, propyl, isopropyl, butyl, sec-butyl, isobutyl, tert-butyl, n-pentyl, hexyl, heptyl, octyl, nonyl, decyl, pentadecyl, and icosyl groups. In some embodiments at least one of $R_1$ to $R_7$ is selected from methyl and propyl. In yet further non-limiting embodiments, at least $R_5$, $R_6$ and $R_7$ are methyl groups, optionally where $R_1$ to $R_4$ are each selected from hydrogen, methyl or fluorocarbon groups.

Non-limiting examples of unsaturated aliphatic hydrocarbon groups that may be suitable for use as one or more of $R_1$ to $R_7$ include substituted or unsubstituted, linear, branched, or cyclic groups having from 1 to 20 carbon atoms, such as 1 to 10 carbon atoms, or even 1 to 3 carbon atoms. Such groups include but are not limited to methylene and substituted or unsubstituted alkenyl groups such as propenyl, isopropenyl, butenyl, isobutenyl, vinyl and hexenyl groups, and the like. In some embodiments at least one of R5 to $R_7$ is a vinyl group.

Non-limiting examples of cyclic hydrocarbon groups that may be suitable for use as one or more of $R_1$ to $R_7$ include alicyclic and non-alicyclic hydrocarbon groups with 4 to 12 carbons in the ring, such as 4 to 10 carbons in the ring, or even 4 to 6 carbons in the ring. Such cyclic hydrocarbon groups include but are not limited to cycloalkyl groups, cycloalkenyl groups, and cycloalkanedienyl groups. Suitable cycloalkyl groups include but are not limited to cyclobutyl, cyclopentyl, cyclohexyl, cycloheptyl, cyclooctyl, and cyclononyl, groups, which may be substituted or unsubstituted. Suitable cycloalkenyl groups include but are not limited to $C_4$-$C_{10}$ cycloalkenyl groups, which may be substituted or unsubstituted. Suitable cycloalkanedienyl groups include but are not limited to $C_4$-$C_6$ cycloalkanedienyl groups, which may be substituted or unsubstituted.

Further non-limiting examples of cyclic hydrocarbon groups that may be suitable for use as one or more of $R_1$ to $R_7$ include mono, bi, and/or polycyclic, substituted or unsubstituted aromatic hydrocarbons having from 5 to 16 carbon atoms, such as 5 to 11 carbon atoms, or even 5 to 9 carbon atoms. Such groups include but are not limited to substituted or unsubstituted benzyl, phenyl, napthyl, and styrene groups. In some embodiments, at least one of $R_1$ to $R_7$ is an unsubstituted or methyl substituted phenyl group. In further non-limiting embodiments, at least $R_5$ and $R_6$ are each unsubstituted or methyl substituted phenyl groups. In yet further non-limiting embodiments at least one of $R_5$ to $R_7$ is a phenyl group.

Non-limiting examples of fluorocarbon groups that may be suitable for use as one or more of $R_1$ to $R_7$ include fluorocarbons of the general formula $C_aH_{2a}C_bF_{(2b+1)}$, where a is greater than or equal to 2 (e.g., from 2 to 4 or even 2 to 3), and b ranges from 1 to 20, such as 1 to 10, or even 1 to 5. Non-limiting examples of such groups include $C_2H_4CF_3$, $C_3H_6CF_3$, $C_2H_4C_2F_5$, $C_3H_6C_2F_5$, etc. In some embodiments, as least one of $R_1$, $R_2$, $R_3$, and/or $R_4$ is $C_2H_4CF_3$. In some non-limiting embodiments, none of $R_1$ to $R_7$ are fluorocarbon groups, whereas in other non-limiting embodiments, at least one of $R_1$ to $R_7$ is a fluorocarbon group.

In one example embodiment of the present disclosure, a poly(phenylene-siloxane) of formula I is used, wherein n=0, m=1, $R_1$ to $R_4$ are hydrogen, and $R_7$ is a phenyl group, as illustrated by formula (I') below:

Formula (I')

where the sites denoted by an ellipsis " . . . " represent extensions of the polymer gel by monomer units consistent with those shown in formula (I'), and $X_2$ is as defined above for formula (I).

With the foregoing in mind, in one example embodiment, $R_1$ to $R_4$ in the above formulae are hydrogen, and $R_5$ to $R_7$ are methyl. In another example embodiment, $R_1$ to $R_4$ in the above formulae are hydrogen, and $R_5$ to $R_7$ are phenyl.

Poly(silphenylene-siloxane) gels consistent with formula (I) may be prepared by any suitable method, such as by curing an appropriate poly(silphenylene-siloxane) copolymer via hydrosilation, condensation, a combination thereof, or some other curing mechanism. In any case, the copolymer may be cured by the application using heat, a curing agent, a catalyst, or some combination thereof. The poly(silphenylene-siloxane) gels of formula (I) may therefore be understood as being derived from a corresponding poly(silphenylene-siloxane) copolymer, also referred to herein as a copolymer resin. With this in mind, non-limiting examples of suitable poly(silphenylene-siloxane) copolymers from which a gel consistent with formula (I) may be derived include copolymer resins of formula (II) below, wherein the different repeating monomer units are delimited by square brackets [ ]:

Formula (II)

in which:

functional groups $R_1$ to $R_7$, a, n and m are as defined above with respect to formula (I);

when the copolymer may be cured via hydrosilation, $A_2$ is an alkenyl, or cycloalkenyl group (e.g., vinyl, allyl, etc.) or, when the copolymer may be cured via condensation, $A_2$ is an oxygen containing group such as but not limited to a hydroxy, alkoxy, alkenoxy, or an aryloxy group, non-limiting examples of which include methoxy, ethoxy, and phenoxy groups;

functional group $A_1$ may be the same or different as $A_2$, and may be selected from a hydrogen atom, a hydroxyl group, an alkoxy group, an alkenoxy group, an alkenyl group, a cycloalkenyl or an aryloxy group, non-limiting examples of which include methoxy, ethoxy, phenoxy, vinyl, and allyl groups;

functional group $A_3$ is one of a hydrogen atom, a linear, branched, cyclic, saturated or unsaturated aliphatic alkyl group, alkenyl group (e.g., vinyl, allyl), or aryl group as described above for groups $R_1$ to $R_7$, and/or a hydrogensilyl group of the formula $SiZ_2H$, where Z is an alkyl, alkenyl, aryl, or fluorocarbon group such as those described above for groups $R_1$ to $R_7$.

In some non-limiting embodiments a copolymer resin consistent with formula (II) is used, in which n and m are as defined above, $R_1$ to $R_4$ are each hydrogen, $R_5$ and $R_6$ are methyl, $R_7$ is a phenyl group, $A_1$ is a hydroxyl group, $A_2$ is an ethoxy group and $A_3$ is an ethoxy group. As will be described later, this example copolymer resin may be cured with a curing agent such as dimethyldiethoxysilane, so as to yield a poly(silphenylene-siloxane) gel consistent with formula (I) above.

In other non-limiting embodiments a copolymer resin consistent with formula (II) is used, in which a, n and m are within the ranges defined above (e.g., a=1, n=0.92, m=0.08); $R_1$, $R_2$, $R_3$, and $R_4$ are each hydrogen; $R_5$, $R_6$, and $R_7$ are methyl; $A_1$ is ethoxy ($OCH_2H_5$); $A_2$ is a vinyl (—CH=$CH_2$); and $A_3$ is ethoxy, as shown in Formula (II') below:

Formula (II')

As will be described later, this example copolymer resin may be cured via hydrosilation with an appropriate curing agent to produce a cured poly(silphenylene-siloxane) gel consistent with formula (I) above. For example, the copolymer resin of formula (II″) may be hydrosilation cured with tris(dimethylsiloxy)phenylsilane to produce a poly(silphenylene-siloxane) gel of formula (I″) below:

Formula (II″)

Where a, m, and n are as described above with respect to formula (II") (e.g., a=1, n=0.92, and m=0.08), $X_2$ is $CH_2CH_2$, and the sites denoted by an ellipsis " . . . " are as described above with respect to formula (I).

In other non-limiting embodiments a copolymer resin consistent with formula (II) is used, in which m is 0, n is 1, and a is within the range described above (e.g., a=1); $R_1$, $R_2$, $R_3$, and $R_4$ are hydrogen; $R_5$ and $R_6$ are phenyl groups; $A_1$ is hydroxyl and $A_3$ is hydrogen, as shown in formula (II") below:

Formula (II")

As will be described later, this example copolymer resin may be cured with an appropriate curing agent to produce a cured poly(silphenylene-siloxane) gel consistent with formula (I) above. For example, the copolymer resin of formula (II") may be cured by reacting it with 1, 3 dimethyltetramethoxydisiloxane to produce a poly(silphenylene-siloxane gel of formula (I'") below:

Formula (I'")

where a is 1, and n is 1 and the sites denoted by an ellipsis " . . . " are as described above with respect to formula (I).

While the foregoing examples mention the use of curing agents, it should be understood that poly(silphenylene-siloxane) copolymers consistent with formula (II) may be cured (e.g., crosslinked) in any suitable manner, including in the absence of a curing agent. For example, the poly (silphenylene-siloxane) copolymers described herein may be cured thermally, i.e., by the application of heat, in which case curing of the copolymer may occur via condensation and/or through another mechanism. By way of example, some poly(silphenylene-siloxane) copolymers of the present disclosure may be cured by exposing them to temperatures ranging from about 100° C. to about 300° C. (e.g., from about 200 to about 250° C.) for a suitable time period, such as from about 1 to 24 hours (e.g., from about 1 to about 10 hours, such as from about 2 to about 8 hours).

Alternatively or in addition to the application of heat, and consistent with the foregoing discussion, the poly(silphenylene-siloxane) copolymers of the present disclosure may be cured with an appropriate curing agent. In such instances, curing of the copolymer may occur via hydrosilation and/or another mechanism. Although the foregoing examples mention the use of specific curing agents (e.g., dimethyldiethoxysilane, tris(dimethylsiloxy)phenylsilane, and dimethyltetramethoxydisiloxane) to cure specific poly(silphenylene-siloxane) copolymers, it should be understood that such curing agents and copolymers are exemplary only, and a wide variety of copolymers and curing agents may be used. More generally, the present disclosure contemplates a wide variety of poly(silphenylene-siloxane) copolymers which may be cured using a curing agent consistent with formula (III) below:

Formula (III)

in which:
$R_1'$, $R_2'$, and $R_3'$, are defined in the same manner as $R_1$, $R_2$, and $R_3$ above with respect to formulas (I) and (II), except that $R_1'$ to $R_3'$ in formulae (III) are not hydrogen;
$A_1$, $A_2$, and $A_3$ are defined in the same manner as described above with respect to formula (II), wherein at least one is capable of crosslinking two or more poly(silphenylene-siloxane) copolymer chains at one or more of the $A_1$, $A_2$ and $A_3$ sites of formula (II); and
c and d represent relative fractions of the different units of the curing agent, wherein $0 \leq c \leq 1$, $0 \leq d \leq 1$, and c+d=1.

In one example embodiment, at least one of $R_1'$ to $R_3'$ in formulae (III) is phenyl. In other non-limiting embodiments, $A_1$ and $A_2$ are hydrogen, $A_3$ is a trimethylsilyl group, and the curing agent may be used to cure a poly(silphenylene-siloxane) copolymer via hydrosilation. In still further embodiments, $A_1$ and $A_2$ are methoxy groups, $A_3$ is a methyl group, and the curing agent may be used of cure a poly (silphenylene-siloxane) copolymer via condensation curing. In either case, d may be greater than or equal to 0.5.

Non-limiting examples of curing agents consistent with formula (III) that may be used include dimethyldiethoxysilane, tris(dimethylsiloxy)phenylsilane, and dimethyltetramethoxydisiloxane, as noted previously. Further non-limiting examples of suitable curing agents include poly(diethoxysiloxane) and poly(phenylmethylsiloxane).

Curing of the poly(silphenylene-siloxane) copolymers (via heat, a curing agent, or a combination thereof) may optionally be performed in the presence of a catalyst. The type and nature of the catalyst may depend on whether a curing agent is used and, if so, the nature of the $A_1$, $A_2$, and/or $A_3$ groups in the curing agent. Examples of suitable catalysts that may be used include platinum, palladium, tin, barium, boron, and/or titanium based catalysts, combinations thereof, and the like. Non-limiting examples of tin containing catalysts include tin tetrachloride, di-n-butyl-dilauryl tin, and/or other organometallic complexes of tin. One non-limiting example of a barium containing catalyst is barium hydroxide. Non-limiting examples of titanium catalysts include organotitanium catalysts such as titanium diisopropoxide. One example of a boron containing catalyst is tris(pentafluorophenyl) borane.

The poly(silphenylene-siloxane) gels of formula (I) may exhibit relatively high long term thermal stability as compared to some optical grade epoxy and siloxane matrices used in many wavelength converted LEDs. In some embodiments, the poly(silphenylene-siloxane) gels of formula (I) may maintain their structural integrity when exposed to temperatures of 250° C. or more, for greater than or equal to about 500, 800, or even 1000 hours. In this regard, "maintaining structural integrity" means that a poly(silphenylene-siloxane) gel may withstand such temperatures for the indicated time period substantially without exhibiting substantial delamination, cracking, or yellowing.

Alternatively or in addition to exhibiting relatively high long term thermal stability, the poly(silphenylene-siloxane) gels described may have a thermal decomposition temperature that is relatively high as compared to some optical grade epoxies and silicones. For example, the poly(silphenylene-siloxane) gels described herein may have a thermal decomposition temperature (as measured by thermogravimetric analysis) of greater than or equal to about 400° C., greater than or equal to about 450° C., greater than or equal to about 500° C., greater than or equal to about 550° C., or even greater than or equal to about 600° C.

Still further, the poly(silphenylene-siloxane) gels of formula (I) may exhibit relatively little thermal degradation at temperatures exceeding 250° C., as compared to some optical grade epoxies and siloxane matrices. For example, the poly(silphenylene-siloxane) gels of formula (I) may exhibit substantially no change in mass when exposed to temperatures of about 250 to 350° C. for up to about 4 hours or more. In some embodiments, the poly(silphenylene-siloxane) gels of formula (I) may lose less than about 5 to about 10% of their mass when exposed to temperatures of up to about 400° C. for up to about 2 hours or more, such as about 4 hours or more. And in further embodiments, the poly(silphenylene-siloxanes) gels of formula (I) may lose less than about 15% of their mass (e.g., less than about 5%) when exposed to temperatures of up to about 400° C. for up to about 2 hours or more, such as about 4 hours or more.

The poly(silphenylene-siloxane) gels of formula (I) may also exhibit desirable optical properties, such as but not limited to optical transparency with regard to incident light of a given wavelength or wavelength range. In some embodiments, poly(silphenylene-siloxane) gels of formula (I) transmit greater than or equal to about 80, 85, 90, 95, or even about 99% of incident light in at least one of the ultraviolet or visible regions of the electromagnetic spectrum. When used in connection with a light emitting diode and a wavelength conversion material, the poly(silphenylene-siloxane) gels of formula (I) preferably transmit greater than or equal to 80, 85, 90, 95, or even about 99% of incident primary light emitted by the light emitting diode, and the same or similar percentage of incident secondary light emitted by the wavelength conversion material.

The poly(silphenylene-siloxane) gels described here may be generally used as an matrix material for at least one wavelength conversion material (component b)) as noted above. In this regard, phosphor particles and/or powders are one exemplary type of conversion material that may form or be included in the wavelength conversion compositions described herein. As may be generally understood by one skilled in the art, a phosphor is a compound capable of emitting, upon excitation by an external energy source (e.g., primary light), useful quantities of radiation (e.g., secondary light") especially in the visible region of the electromagnetic spectrum. Non-limiting examples of such phosphors include powdered and/or particulate forms of one or more inorganic phosphors such as powdered and/or particulate oxyfluorate, nitride (including oxynitride), and oxide phosphors (e.g., aluminum garnets, silicates etc.).

More specific non-limiting examples of suitable wavelength conversion materials include powdered or particulate phosphors containing one or more of cerium-activated yttrium aluminum garnets, $Y_3Al_5O_{12}$:Ce, (YAG:Ce), cerium-activated yttrium gadolinium aluminum garnets, $(Y,Gd)_3Al_5O_{12}$:Ce, (YGdAG:Ce), cerium-activated lutetium aluminum garnets, $Lu_3Al_5O_{12}$:Ce, (LuAG:Ce), europium-activated alkaline earth (AE) silicon oxynitride, $(Ba,Sr,Ca)Si_2O_2N_2$:Eu, (AE-SiON:Eu), and europium-activated metal-SiAlON (M-SiAlON:Eu), e.g., Ca—SiAlON:Eu.

The wavelength conversion materials described herein may be doped with a small amount of an activator ion such as but not limited to cerium, gadolinium, scandium, europium, combinations thereof, and the like. When used, the amount of activator ion may vary widely, e.g., from greater than 0 to about 10 atomic %, such as about 1 to about 5 atomic %, or even about 1 to 2 atomic percent. In one non-limiting embodiment, the wavelength converting compositions described herein include a combination of $(Y_{2.94}Ce_{0.06})Al_5O_{12}$, $(Y_{2.67}Ce_{0.03}Gd_{0.3})Al_5O_{12}$, and $(Lu_{2.97}Ce_{0.03})Al_5O_{12}$ as a wavelength conversion material.

In addition to the poly(silphenylene-siloxane) gel matrix and the wavelength conversion materials described above, the wavelength converting compositions may optionally include one or more optically transparent inorganic materials (i.e., optional component c)). Non-limiting examples of suitable optically transparent inorganic materials include powdered and/or particulate forms of aluminum nitride, aluminum oxide, silicon dioxide (e.g., fumed silica, quartz, cristobalite, etc.), titanium dioxide, and zirconium dioxide. Among other things, the optically transparent inorganic material may affect one or more properties of the wavelength converting compositions. For example, increasing the amount of optically transparent inorganic materials in the poly(silphenylene-siloxane) matrix may result in corresponding increase in the thermal conductivity of the wavelength converting composition. Other properties such as the viscosity of the wavelength converting composition, and/or the amount of light scattering within the wavelength converting composition may also be tuned by controlling the amount of optically transparent inorganic material in the wavelength conversion composition.

The wavelength conversion material (i.e., component b)) and optional optically transparent inorganic material (i.e., component c)) may be distributed in the poly(silphenylene-siloxane) gel matrix (i.e., component a)) in any suitable manner. For example, one or both of such materials may be distributed homogenously, inhomogenously (e.g., in a pattern), or in some other manner within the poly(silphenylene-siloxane) matrix. Without limitation, the wavelength conversion material and optional optically transparent inorganic material (if used) are preferably homogenously distributed within a poly(silphenylene-siloxane) gel matrix.

In addition to the aforementioned components, the wavelength converting compositions of the present disclosure may contain other fillers and/or additive materials, such as anti-static agents, antioxidant dyes, pigments, and plasticizers, materials that absorb light in a specified region of the electromagnetic spectrum, nucleating agents, and the like. Such materials may be added in any quantity, but are preferably added in amounts that do not detract from the optical and thermal properties of the wavelength converting compositions, and/or the formation of the poly(silphenylene-siloxane) gel matrix. Accordingly, one or more fillers and/or additives may be added to the wavelength converting compositions described herein in an amount less than or equal to about 10 weight %, such as less than or equal to about 7.5 weight %, less than or equal to about 5 weight %, less than or equal to about 2.5 weight %, less than or equal to about 1%, or even less than or equal to about 0.5 weight %, relative to the total weight of the wavelength converting composition.

To form the wavelength conversion composition, the wavelength conversion material, optional optically transparent inorganic material, and/or optional fillers/additives may be incorporated into the poly(silphenylene-siloxane) gel matrix in any suitable manner. For example, incorporation of such materials into the poly(silphenylene-siloxane) gel matrix may be accomplished by mechanically mixing the wavelength conversion material into an uncured copolymer resin consistent with formula (II) above, after which the copolymer resin may be cured as previously discussed.

Another aspect of the present disclosure relates to wavelength converters that include or are formed by one or more wavelength converting compositions consistent with the present disclosure, and which may be used to perform wavelength conversion in one or more lighting devices. In general, such wavelength converters may include a wavelength conversion composition as described above, which may have been formed into a self-supporting structure or mechanically or chemically adhered to another supporting structure, such as a substrate. Such converters may be manufactured using any suitable method, such as by mixing an uncured copolymer resin consistent with formula (II) above with component b) and optionally component c) above, depositing (e.g., by casting, over-molding, etc.) the resulting mixture in a mold, and curing the mixture as described above. In some embodiments, the mold may be a cavity of a light source such as a light emitting diode package. In such instance, a wavelength converter consistent with the present disclosure may be formed by over molding or casting a mixture of uncured copolymer resin consistent with formula (II) above and component b) (and optionally component (c) within the cavity of the light source, after which the composition may be cured within the cavity using an appropriate curing process as described above.

Yet another aspect of the present disclosure relates to light sources that include a wavelength converter consistent with the present disclosure. Although the present disclosure contemplates the use of the wavelength converters and wavelength converting compositions in a wide variety of light sources, such converters and converting compositions may be particularly suitable for use in solid state light sources such as a light emitting diode package. In such application, the wavelength converters described herein may convert incident primary light emitted from a light emitting diode and convert all or a portion of such light to secondary light.

Figure 1A:
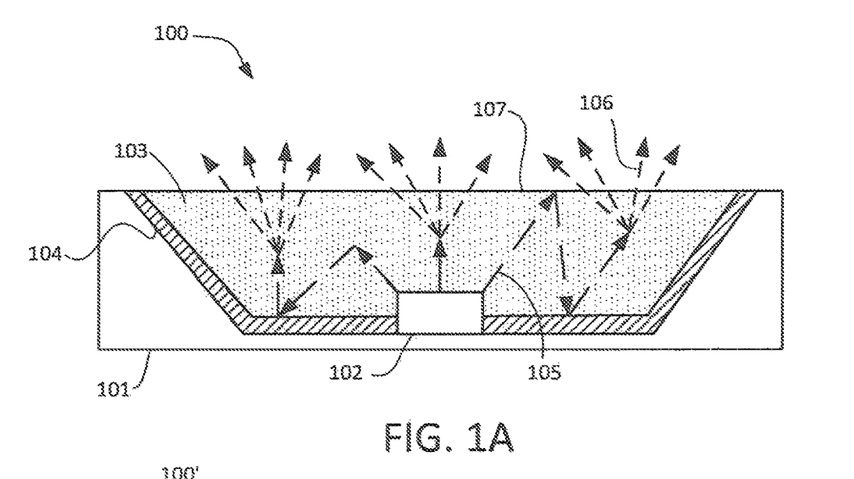
FIGS. 1A and 1B depict example wavelength converted light emitting diode packages having a chip level conversion structure, consistent with the present disclosure.

Reference is therefore made to FIG. 1A, which depicts one example of an LED light source (e.g., an LED lighting package) including a wavelength converter consistent with the present disclosure. As shown, LED lighting package 100 includes LED frame 101, LED 102, wavelength converter 103, and optional reflector 104. LED frame 101 includes a cavity (not labeled) in which LED 102 is disposed. In this embodiment, optional reflector 104 is disposed about LED 102, wavelength converter 103 and LED frame 101. Wavelength converter 103 is disposed within the cavity of LED lighting package 100 and is in contact with the light emitting surface of LED 102.

LED frame 101 may be any frame that is suitable for supporting LED 102, wavelength converter 103, and optional reflector 104. In some embodiments, LED frame 101 may be a circuit board containing electrical circuits, contacts, etc. for driving LED 102. In such instances, it may be understood that LED frame 101 includes components that may be sensitive to contact with other electrically conductive components. Alternatively or additionally, LED frame 101 may be a support structure that provides mechanical support for other components in LED lighting package 100.

LED 102 may be any LED that is capable of emitting primary light from a light emitting surface thereof. Although LEDs that emit primary light in the blue region are preferred, LEDs that emit primary light in other regions of the spectrum may also be used. Regardless of its nature, LED 102 may emit primary light 105 from an emitting surface thereof (not labeled). Primary light 105 may be emitted from LED 102 in any direction, but preferably towards the aperture (not labeled) of LED lighting package 100. Consistent with the foregoing discussion, wavelength converter 103 may include a wavelength converting composition that includes a poly(silphenylene-siloxane) gel matrix that contains a generally homogeneous dispersion of a wavelength conversion material, such as a plurality of phosphor particles that are capable of converting primary light 105 to secondary light 106. In one embodiment, LED 102 emits a blue primary light that is at least partially converted to yellow secondary light by the phosphor particles (e.g., YAG:Ce) in the poly(silphenylene-siloxane) gel matrix.

Regardless of the nature of wavelength converter 103 and the wavelength converting material contained therein, some portion of primary light 105 emitted from LED 102 may be back scattered, i.e., reflected or scattered towards the base (not labeled) of the cavity (not shown) defined by LED frame 101. For example, some of primary light 105 may impinge on wavelength-converting material in wavelength converter 103 and be scattered back towards LED 102, instead of being converted to secondary light 106. Alternatively or additionally, a portion of primary light 105 may pass through wavelength converter 103 without being converted to secondary light. While such primary light may escape LED lighting package 100, some portion of it may be backscattered towards LED 102 when it impinges on interface 107, which may be understood to be a "polymer-air interface." These concepts are illustrated in FIG. 1A by the redirection of arrows of primary light 105 from interface 107 and within encapsulating material 103 back towards LED 102.

With this in mind, optional reflector 104 may be used to redirect primary and/or secondary light towards the aperture of LED lighting package 100. In this regard, any suitable reflector may be used as optional reflector 104, provided that it can reflect a sufficient quantity of incident primary light 105 and/or second light 106. In that regard, optional reflector 104 may be preferably configured to reflect greater than or equal to about 75%, 85%, 95%, or even 99% of primary light 105 and/or secondary light 106 that is incident thereon.

Due to its reflective properties, optional reflector 104 may reflect backscattered primary light 105 such that it again impinges on wavelength converter 103. As a result, optional reflector 104 may increase the opportunity for backscattered primary light 105 to be converted to secondary light 106, thus improving the conversion efficiency and the secondary light output of LED lighting package 100.

Figure 1B:
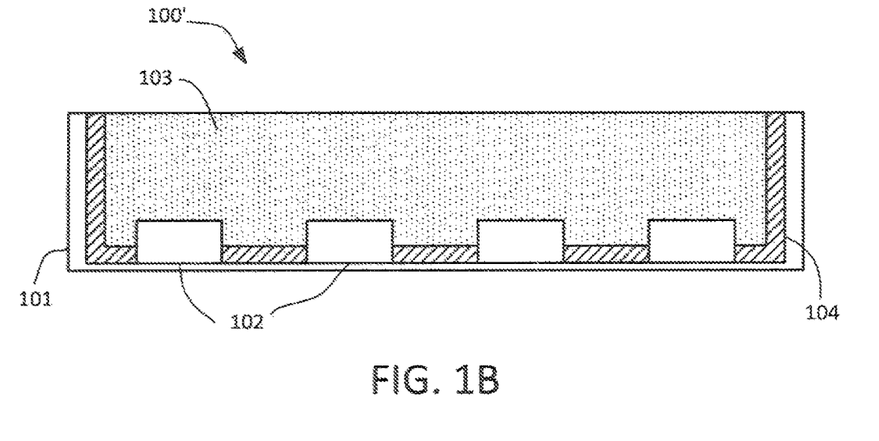

FIG. 1B illustrates another example of an LED lighting package including a wavelength converter consistent with the present disclosure. As shown, LED lighting package 100' includes LED frame 101, LEDs 102, wavelength converter 103, and optional reflector 104. Apart from the use of multiple LEDs 102 and the distribution of optional reflector 104 between such LEDs, the nature and function of the components of LED lighting package 100' is the same as the similarly numbered components in FIG. 1A. The operation and configuration of such components is therefore not reiterated.

Figure 2:
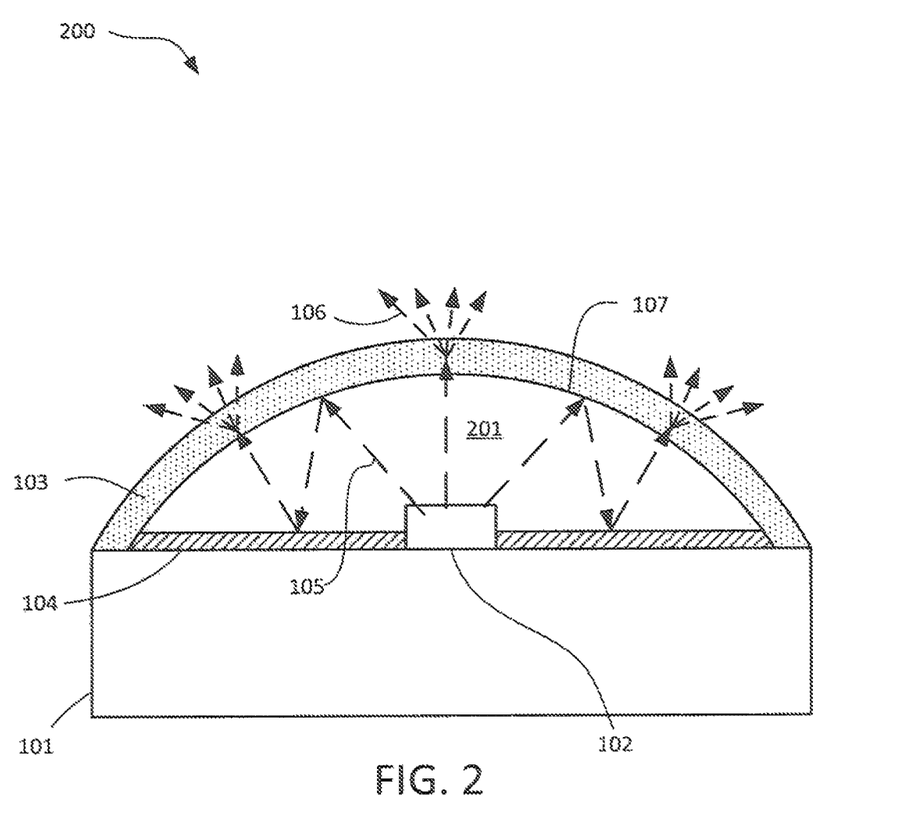
FIG. 2 depicts an example wavelength converted light emitting diode package having a remote phosphor configuration, consistent with the present disclosure.

FIG. 2 illustrates yet another example of an LED lighting package that includes a wavelength converter consistent with the present disclosure. As shown, LED lighting package 200 includes LED frame 101, LED 102, wavelength converter 103, and optional reflector 104. In contrast to the LED lighting packages of FIGS. 1A and 1B, wavelength converter 103 is illustrated as being disposed at some distance away from the light emitting surface (not labeled) of LED 102, e.g., by gap 201. LED lighting package 200 may therefore be understood as being of a remote phosphor configuration, whereas the configurations shown in FIGS. 1A and B may be understood as being of a chip level conversion configuration. Apart from these differences, the nature and function of the components of FIG. 2 are the same as described above for FIGS. 1A and 1B. The operation and configuration of such components is therefore not reiterated.

Figure 3:
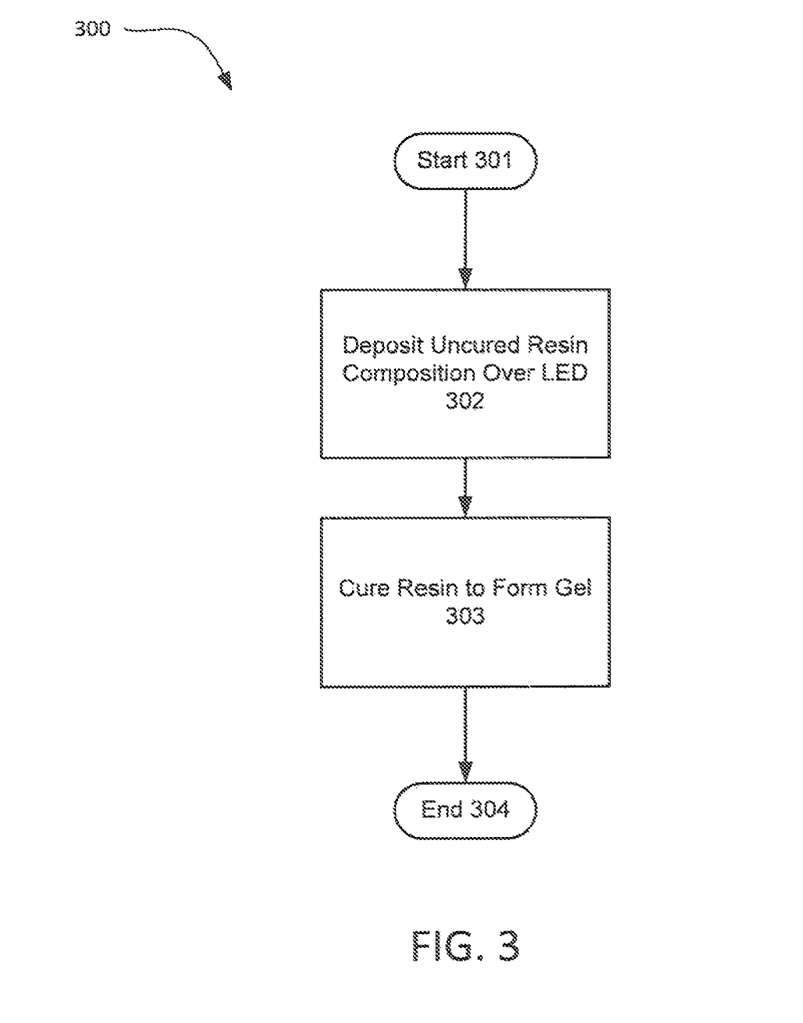
FIG. 3 is a flow chart depicting exemplary operations of one example method of making a wavelength converted light emitting diode package consistent with the present disclosure.

Another embodiment of the present disclosure relates to methods of manufacturing wavelength converted light sources, such as a wavelength converted LED. Reference is therefore made to FIG. 3, which depicts exemplary operations of one method of manufacturing a wavelength converted light source consistent with the present disclosure. As shown, method 300 begins at block 301. At block 302, the method may proceed by depositing (e.g., by overmolding, volume casting, combinations thereof, or the like) an uncured resin composition over a light emitting device, such as within the cavity of a LED lighting package. The uncured resin composition may include a mixture of an uncured poly(silphenylene-siloxane) copolymer resin with a powdered and/or particulate wavelength conversion material and optionally an optically transparent inorganic material, such as those discussed above. The method may then proceed to block 303, wherein the uncured poly(silphenylene-siloxane) copolymer resin in the uncured resin composition may be cured as described above. The method may then proceed to block 304 and end.

Figure 4:
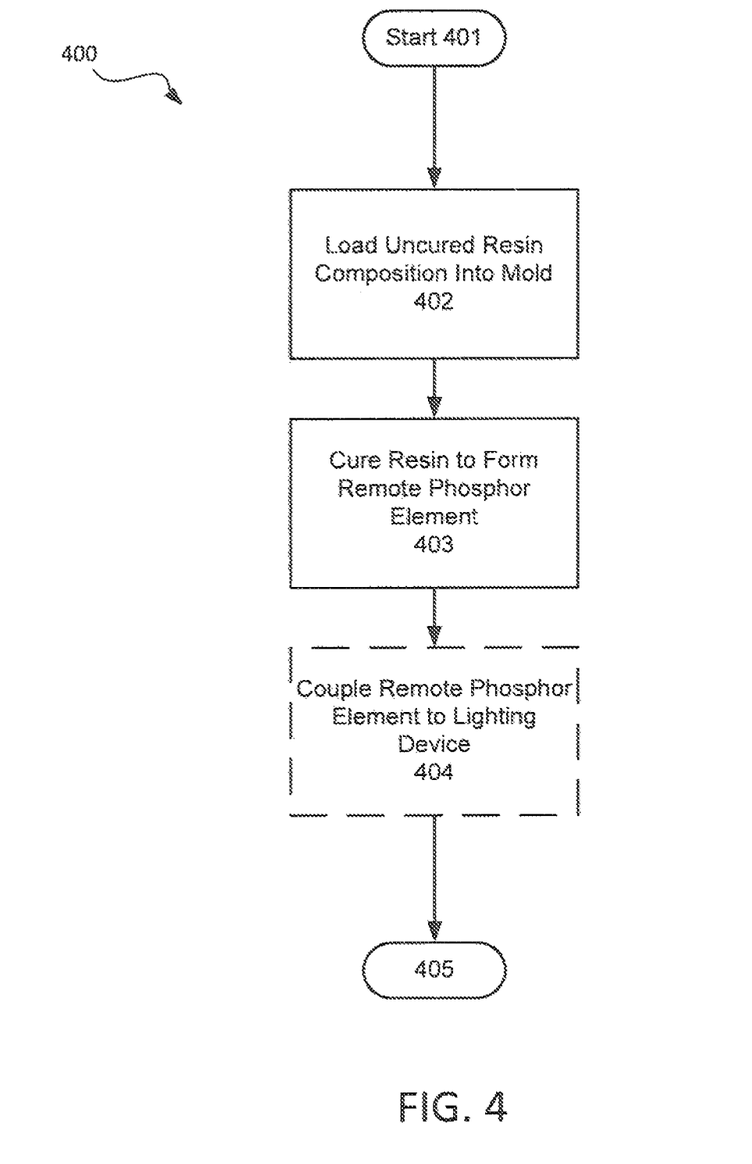
FIG. 4 is a flow chart depicting exemplary operations of an example method of making a remote conversion element and/or a wavelength converted light source consistent with the present disclosure.

FIG. 4 depicts exemplary operations of another method of manufacturing a wavelength converter and optionally a wavelength converted light source consistent with the present disclosure. As shown, method 400 begins at block 401. At block 402, the method may proceed by loading an uncured resin composition into a mold. The uncured resin composition may include a mixture of an uncured poly(silphenylene-siloxane) copolymer resin with a powdered and/or particulate wavelength conversion material and optionally an optically transparent inorganic material, such as those discussed above. The method may then proceed to block 403, wherein the uncured poly(silphenylene-siloxane) copolymer resin in the uncured resin composition may be cured using heat, a curing agent, a catalyst, or some combinations thereof, so as to form a remote conversion element (e.g., wavelength converter 103 as shown in FIG. 2). At this point the method may end or it may proceed to optional block 404, wherein the remote phosphor element may be coupled to an LED lighting package, e.g., such that the remote phosphor element is positioned so that the primary light emission of the LED impinges on it. Once coupling is complete (or if the processes of block 404 are not performed), the method may proceed to block 405 and end.

EXAMPLES

Various poly(silphenylene-siloxane) gels consistent with the present disclosure were produced as described below in examples 1 through 3. The thermal stability of those copolymer gels was analyzed using thermogravimetric analysis and isometric thermal analysis and compared to two comparative examples (an optical grade silicone and polydimethylsiloxane). The results of those analyses are presented in FIGS. 5 and 6, respectively.

Example 1

A sample of poly(silphenylene-siloxane) gel was synthesized by mixing 4.0 g of bis(dimethylsilyl)benzene and 4 mL of anhydrous hexane in a 100 mL flame-dried Schlenk flask equipped with a stir bar. To this mixture was added 0.131 mL of a 40 mg/mL solution of tris(pentafluorophenyl)borane (catalyst) in p-xylene. The flask was closed with a septum and connected to a nitrogen line. A mixture of 2.122 g of phenyltriethoxysilane in 2 mL of anhydrous hexane was then added dropwise in 0.2 mL portions via syringe, while stirring the contents at room temperature. A 10-20 second delay followed each addition to permit ethane generated by the addition to escape. A mixture of 0.45 g of dimethyldiethoxysilane (a curing agent consistent with formula (II)) in 1 mL of anhydrous hexane was then added to the flask dropwise in the same manner as above, resulting in the formation of a gel.

The gel was retrieved from solution, washed with two 30 ml portions of hexane and one 30 mL portion of toluene. The gel was then soaked in 50 mL of tetrahydrofuran (THF) for 2 hours to extract the unreacted material and catalyst, followed by rinsing on a paper filter with acetone and isopropanol and drying in vacuum at 60° C. for 24 hours, yielding 3.9 g of the polymer gel having the structure shown in formula (I') above.

Example 2

A sample of poly(silphenylene-siloxane) copolymer resin was synthesized by mixing 4.0 g of bis(dimethylsilyl)benzene and 0.262 mL of a 40 mg/mL solution of tris(pentafluorophenyl)borane (catalyst) to a 100 mL flame-dried Schlenk flask equipped with a stir bar. The flask was closed with a septum and connected to a nitrogen line. A mixture of 2.817 g of dimethyldiethoxysilane and 0.266 g of vinylmethyldiethoxysilane (co-monomers) in 3 mL of anhydrous hexane was then added dropwise in 0.2 mL portions while stirring. Ethane formation occurred upon each addition. Once gas evolution ceased, the mixture was allowed to stir for 2 hours. A 2 g amount of activated neutral alumina and 20 mL of hexane was then added to the flask. The liquid in the flask was decanted, filtered, and the solvent was evaporated.

The product was dissolved in 40 mL of THF and a copolymer resin was precipitated from the mixture via the addition of 90 mL of methanol. The solid was collected and dried in vacuum until constant mass, yielding 4.0 g of a copolymer resin of formula (II') above. The molecular mass of the resin was determined by size exclusion chromatography in tetrahydrofuran using polystyrene standards. The number average molecular weight ($M_n$) was 27900 g/mol, and the ratio of Mn to the weight average molecular weight (Mw) was $M_w/M_n=1.8$. The ratio of n:m was determined by nuclear magnetic resonance to be 0.92:0.08.

The copolymer resin was cured into a solid gel via the addition of 0.044 mL of tris(dimethylsiloxy)phenylsilane and 0.018 mL of a 50 mg/mL solution of a 3% platinum complex in cyclic polysiloxane (0.027 mg of the Pt complex) to 1.0 g of the copolymer, after which the mixture was heated at 100° C. for 1 hour and 150° C. for 2 hours. A poly(silphenylene-siloxane) gel having the structure of formula (I") resulted.

Comparative Example 1

A commercial optical grade methyl silicone was used as a reference material. The resin was cured into a solid gel by combining 2.0 g of a base resin and 0.2 g of a curing agent, after which the mixture was heated at 100° C. for 1 hour and 150° C. for 2 hours.

The gels produced by examples 1 and 2 and comparative example 1 were subjected to thermogravimetric analysis. The analysis was performed by heating approximately 15-20 mg of the polymer gels in a thermogravimetric analysis chamber in air. The temperature of the chamber was ramped from room temperature to 850° C. at a rate of 15° C./min. The results of the analysis are presented in FIG. 5. Samples of the gels were also subjected to isothermal analysis by heating each sample from room temperature to 400° C. at the rate of 50° C./min. The samples were maintained at 400° C. for 4 hours, during which the mass of each sample was monitored. The results of this analysis are presented in FIG. 6.

Figure 5:
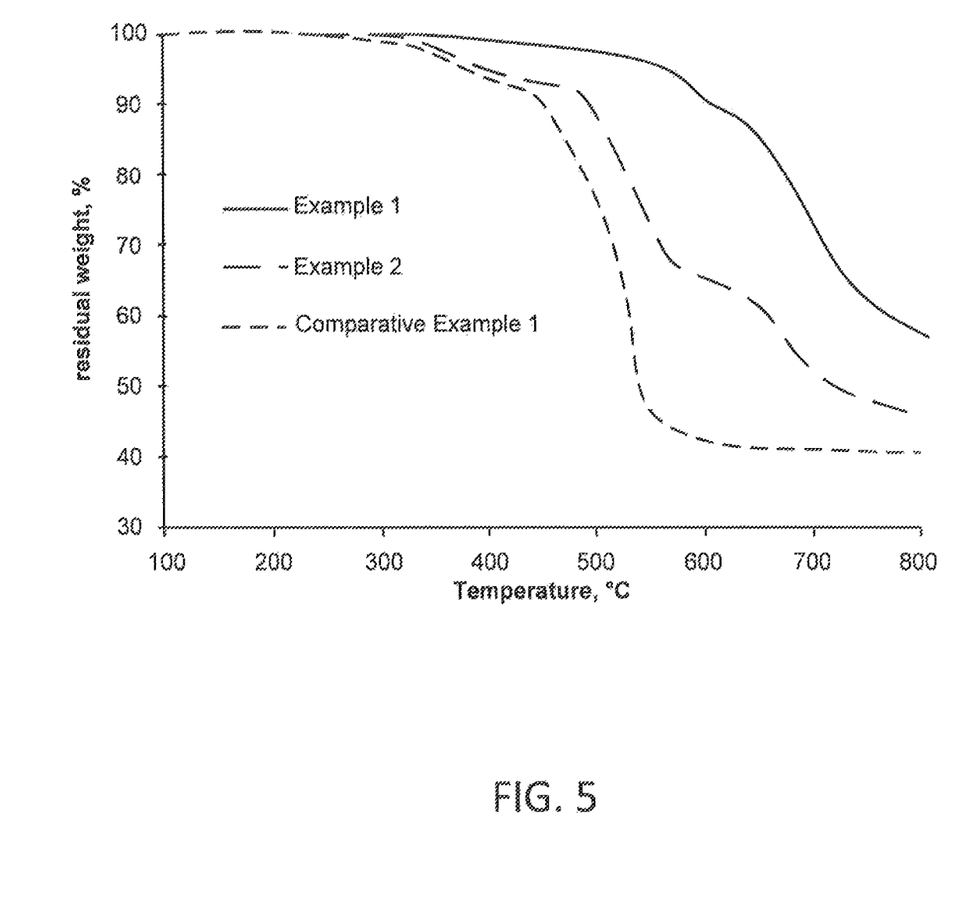
FIG. 5 is a graph plotting a thermographic analysis of two poly(silphenylene-siloxanes) consistent with the present disclosure against that of a commercial optical grade silicone.
Figure 6:
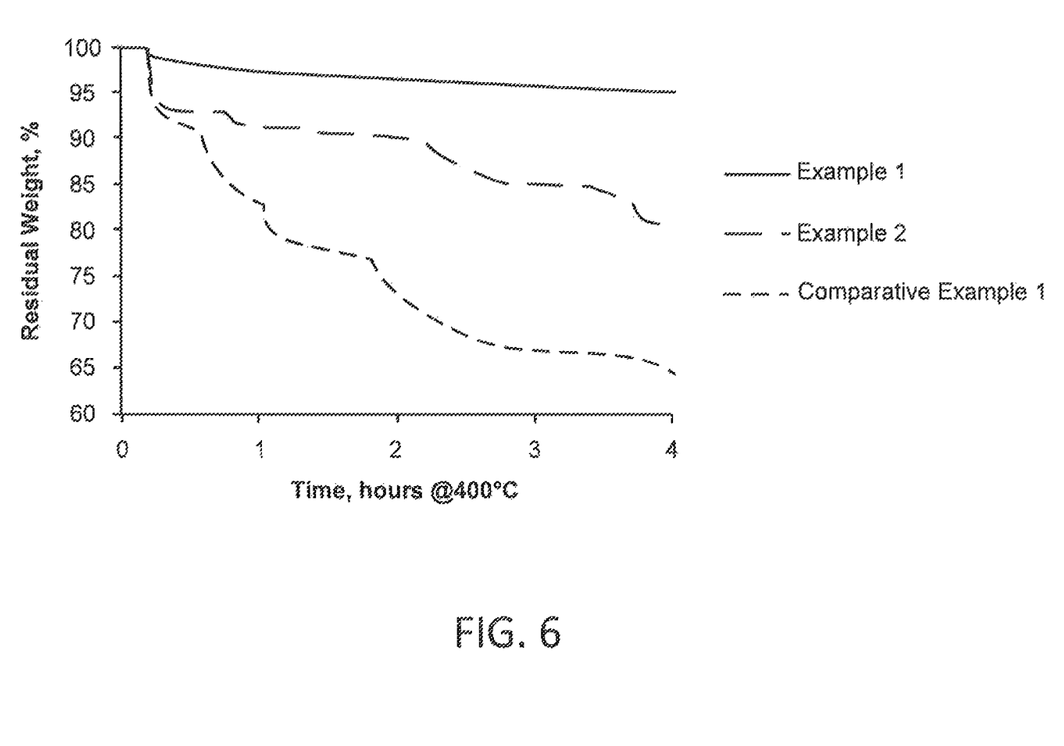
FIG. 6 is a graph plotting a isothermal analysis of two poly(silphenylene-siloxanes) consistent with the present disclosure against that of a commercial optical grade silicone.

The results shown in FIG. 5 demonstrate that the poly(silphenylene-siloxane) gels of examples 1 and 2 exhibited a higher decomposition temperature than the optical grade silicone of comparative example 1. In addition, the poly(silphenylene-siloxane) gel of example 1 (prepared by condensation) had a significantly higher decomposition temperature than the polysilphenylene-siloxane gel of example 2 (prepared by hydrosilation in the presence of a curing agent and a platinum catalyst).

As shown in FIG. 5, the poly(silphenylene-siloxane) gel of example 1 also did not experience any noticeable change in mass at temperatures up to 350° C. This suggests that the material did not degrade when exposed to such temperatures. The results in FIG. 6 further demonstrate that the loss of mass exhibited by the poly(silphenylene-siloxane) gels of examples 1 and 2 at 400° C. were both significantly lower than the loss of mass exhibited by the optical grade silicone of the comparative example at the same temperature. This indicates that the poly(silphenylene-siloxane) gels of example 1 and 2 exhibit greater long term stability at elevated temperatures.

Also of note is that FIG. 5 indicates that the loss of mass exhibited by the poly(silphenylene-siloxane) gel of example 1 (prepared by condensation) was significantly less than that of the poly(silphenylene-siloxane) gel of example 2 (prepared by hydrosilation in the presence of a curing agent and a platinum catalyst), even at temperatures exceeding 500° C.

Example 3

A sample of poly(silphenylene-diphenylsiloxane) was synthesized by adding 6.79 g of bis(hydroxydimethylsilyl)benzene, 7.32 g of diphenyldimethoxysilane, 30 mg of $Ba(OH)_2 \cdot H_2O$, and 10 mL of N,N'-dimethylformamide to a 100 mL flame-dried Schlenk flask equipped with a stir bar. The flask was closed with a septum, connected to a nitrogen line, and immersed in an oil bath at 120° C. for 30 hours with stirring. The flask was then was cooled to room temperature, and the contents poured into 70 mL of methanol, whereupon the mixture separated into a top layer and a bottom layer. The top layer was decanted. The bottom layer was dissolved in 10 mL of dichloromethane, filtered through a 0.45 µm syringe filter, and dried in vacuum to yield a transparent viscous copolymer resin. An $^1$H-NMR analysis established that the copolymer resin was of formula (II''') above.

The copolymer resin was mixed with 1,3-dimethyltetramethoxydisiloxane, and bis(2-ethylhexanoate)tin with a mass ratio of 100:5:0.1. The resulting mixture was poured into a Teflon mold and heated at 250° C. for 2 hours to obtain a 10×10×1 mm poly(silphenylene-siloxane) gel of formula (I''').

Comparative Example 2

As a reference, a poly(dimethyl siloxane) rubber was prepared by mixing a vinyl terminated poly(dimethylsiloxane) having a molecular weight of 28000 g/mol (DMS-V31 from Gelest, Inc.) and poly(dimethylsiloxane-co-methylhydrosiloxane) copolymer having 30 mol % of Si—H groups (HMS-301 from Gelest, Inc) in a weight ratio of 95:5. To that mixture was added 15 ppm of a Pt complex catalyst, and the mixture was heated in a Teflon mold at 100° C. for 2 hours to obtain a 10×10×1 mm piece of elastomer.

To investigate their long term thermal stability, samples obtained from example 3 and comparative example 2 were placed in the oven at 250° C. in air for 800 hours. Visual observation of the samples were recorded at 100 and 800 hours. The results are presented in Table 1 below. As shown, the sample obtained from comparative example 2 became hard and brittle after 100 hours of thermal ageing at 250° C., and cracked into pieces due to internal stress after 800 hours. In contrast, the poly(silphenylene-siloxane) sample from example 3 remained soft and rubbery throughout the entire experiment and did not develop any yellow color. This suggested that the poly(silphenylene-siloxane) gel has significantly greater long term stability at high operating temperatures compared to the silicone of comparative example 2.

TABLE 1 thermal ageing of methyl silicone and poly(silphenylene-siloxane)

| Time | Appearance of Example 3 | Appearance of Comparative Example 2 |
|---|---|---|
| As-prepared | Transparent soft gelly-like sample | Transparent rubbery sample |
| 100 hours of ageing | Transparent rubbery sample | Transparent hard glassy sample |
| 800 hours of ageing | Transparent rubbery sample | Sample cracked into several pieces |

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A wavelength converting composition comprising:
   a polymeric matrix comprising at least one poly(silphenylene-siloxane) gel; and
   at least one wavelength converting material contained in the polymeric matrix, wherein the at least one poly(silphenylene-siloxane) gel comprises a poly(silphenylene-siloxane) gel of formula (I):

wherein $R_1$ to $R_7$ are the same or are different and are selected from the group consisting of hydrogen atoms, substituted or unsubstituted, saturated or unsaturated, linear, branched or cyclic aliphatic hydrocarbon groups, aromatic hydrocarbon groups, fluorocarbon groups and combinations thereof, wherein $X_2$ is a linking group selected from the group consisting of an alkylene group, an oxygen atom and a group derived from a curing agent, wherein a is an integer ranging from 1 to 3, wherein n and m represent relative fractions of different monomer units in the gel, where $0 \leq n \leq 1$, $0 \leq m \leq 1$, and n+m equals 1, and wherein sites denoted by an ellipsis represent a continuation of the polymer with the same or similar monomer units as depicted in formula (I).

2. The wavelength converting composition of claim 1, wherein the at least one poly(silphenylene-siloxane) gel is present in the composition in an amount ranging from greater than about 50 to about 99% by weight, and wherein the wavelength converting material is present in the composition in an amount ranging from about 1 to about 50% by weight.

3. The wavelength converting composition of claim 1,
wherein $R_1$, $R_2$, $R_3$, and $R_4$ are hydrogen atoms,
wherein $R_5$ and $R_6$ are methyl groups, and
wherein $R_7$ is selected from a phenyl group and a methyl group.

4. The wavelength converting composition of claim 1,
wherein n=0,
wherein $R_1$, $R_2$, $R_3$, and $R_4$ are hydrogen atoms, and
wherein $R_7$ is an aryl group.

5. The wavelength converting composition of claim 4, wherein $R_7$ is phenyl.

6. The wavelength converting composition of claim 1, wherein the poly(silphenylene-siloxane) gel is crosslinked via at least one of the sites denoted by an ellipsis.

7. The wavelength converting composition of claim 1, wherein $X_2$ is a linking group derived from a curing agent or a corresponding moiety of an uncured poly(silphenylene-siloxane) copolymer.

8. The wavelength converting composition of claim 7, wherein the curing agent is of the formula:

wherein $R_1'$ to $R_3'$ are the same or are different and are selected from the group consisting of substituted or unsubstituted, saturated or unsaturated, linear, branched or cyclic aliphatic hydrocarbon groups, aromatic hydrocarbon groups, fluorocarbon groups and combinations thereof, wherein at least one of $A_1$, $A_2$ and $A_3$ are capable of crosslinking two of more chains of the poly(silphenylene-siloxane) gel via at least one of $X_2$ or the sites denoted by an ellipsis, wherein $A_2$ corresponds to or is a precursor of $X_2$, and is selected from the group consisting of an alkenyl group, a hydroxyl group, an alkoxy group, an alkenoxy group and an aryloxy group, wherein $A_1$ is selected from the group consisting of a hydrogen atom, a hydroxyl group, an alkoxy group, an alkenoxy group, an aryloxy group, an alkyl group and an alkenyl group, wherein $A_3$ is one of a hydrogen atom, a linear, branched, cyclic, saturated or unsaturated aliphatic alkyl group, an alkenyl group, an allyl group, an aryl group, or a hydrogensilyl group of the formula $SiZ_2H$, where Z is an alkyl group, an alkenyl group, an aryl group, or a fluorocarbon group, and wherein $0 \leq c \leq 1$, $0 \leq d \leq 1$, and c+d equals 1.

9. The wavelength converting composition of claim 8, wherein $A_1$ is a hydroxyl group, $A_2$ is an ethoxy group and $A_3$ is an ethoxy group.

10. The wavelength converting composition of claim 1, wherein the wavelength converting material comprises a phosphor.

11. The wavelength converting composition of claim 10, wherein the phosphor is selected from the group consisting of cerium-activated yttrium aluminum garnet phosphors, cerium-activated yttrium gadolinium aluminum garnet phosphors, cerium-activated lutetium aluminum garnet phosphors, europium-activated alkaline earth silicon oxynitride phosphors, europium-activated metal-SiAlON phosphors and combinations thereof.

12. The wavelength converting composition of claim 1, further comprising at least one optically transparent inorganic particulate material.

13. An LED light source comprising:
at least one LED configured to emit primary light in a first wavelength range from a light emitting surface thereof; and
a wavelength converter disposed over the at least one LED, the wavelength converter comprising a wavelength converting composition comprising:
a polymeric matrix comprising at least one poly(silphenylene-siloxane) gel; and
at least one wavelength converting material contained in the polymeric matrix, the wavelength converting material capable of converting at least a portion of the primary light to secondary light in a second wavelength range,
wherein the at least one poly(silphenylene-siloxane) gel comprises a poly(silphenylene-siloxane) gel of formula (I):

wherein $R_1$ to $R_7$ are the same or are different and are chosen from the group consisting of hydrogen atoms, substituted or unsubstituted, saturated or unsaturated, linear, branched or cyclic aliphatic hydrocarbon groups, aromatic hydrocarbon groups, fluorocarbon groups and combinations thereof, wherein $X_2$ is a linking group selected from the group consisting of an alkylene group, an oxygen atom and a group derived from a curing agent, wherein a is an integer ranging from 1 to 3, wherein n and m represent relative fractions of different monomer units in the gel, where $0 \leq n \leq 1$, $0 \leq m \leq 1$, and n+m equals 1, and wherein sites denoted by an ellipsis represent a continuation of the polymer with the same or similar monomer units as depicted in formula (I).

14. The LED light source of claim 13, wherein the at least one poly(silphenylene-siloxane) gel is present in the composition in an amount ranging from greater than about 50 to about 99% by weight, and wherein the wavelength converting material is present in the composition in an amount ranging from about 1 to about 50% by weight.

15. The LED light source of claim 13,
wherein $R_1$, $R_2$, $R_3$, and $R_4$ are hydrogen atoms,
wherein $R_5$ and $R_6$ are methyl groups, and
wherein $R_7$ is chosen from a phenyl group and a methyl group.

16. The LED light source of claim 13,
wherein n=0,
wherein $R_1$, $R_2$, $R_3$, and $R_4$ are hydrogen atoms, and
wherein $R_7$ is an aryl group.

17. The LED light source of claim 15, wherein $R_7$ is phenyl.

18. The LED light source of claim 13, wherein the poly(silphenylene-siloxane) gel is crosslinked via at least one of the sites denoted by an ellipsis.

19. The LED light source of claim 13, wherein the poly(silphenylene-siloxane) gel is crosslinked via a linking group derived from a curing agent.

20. The LED light source of claim 19, wherein the curing agent is of the formula:

wherein functional groups $R_1'$ to $R_3'$ are the same or different and are chosen from the group consisting of substituted or unsubstituted, saturated or unsaturated, linear, branched or cyclic aliphatic hydrocarbon groups, aromatic hydrocarbon groups, fluorocarbon groups and combinations thereof, wherein at least one of $A_1$, $A_2$ and $A_3$ are capable of crosslinking two of more chains of the poly(silphenylene-siloxane) gel via at least one of $X_2$ or the sites denoted by an ellipsis, wherein $A_2$ corresponds to or is a precursor of $X_2$, and is selected from the group consisting of an alkenyl group, a hydroxyl group, an alkoxy group, an alkenoxy group and an aryloxy group, wherein $A_1$ is selected from the group consisting of a hydrogen atom, a hydroxyl group, an alkoxy group, an alkenoxy group, an aryloxy group, an alkyl group, an alkenyl group and an allyl group, wherein $A_3$ is one of a hydrogen atom, a linear, branched, cyclic, saturated or unsaturated aliphatic alkyl group, an alkenyl group, an allyl group, an aryl group, or a hydrogensilyl group of the formula $SiZ_2H$, where Z is an alkyl group, an alkenyl group, an aryl group, or a fluorocarbon group, and wherein $0 \leq c \leq 1$, $0 \leq d \leq 1$, and c+d equals 1.

21. The LED light source of claim 20, wherein $A_1$ is a hydroxyl group, $A_2$ is an ethoxy group and $A_3$ is an ethoxy group.

22. The LED light source of claim 13, wherein the wavelength converting material comprises a phosphor selected from the group consisting of cerium-activated yttrium aluminum garnet phosphors, cerium-activated yttrium gadolinium aluminum garnet phosphors, cerium-activated lutetium aluminum garnet phosphors, europium-activated alkaline earth silicon oxynitride phosphors, europium-activated metal-SiAlON phosphors and combinations thereof.

23. The LED light source of claim 13, further comprising at least one optically transparent inorganic particulate material.

24. A method of manufacturing a wavelength converting composition, the method comprising:
distributing a wavelength conversion material in an uncured resin to form a mixture, the uncured resin comprising a poly(silphenylene-siloxane) copolymer resin; and
curing the poly(silphenylene-siloxane) copolymer resin to form a poly(silphenylene-siloxane) gel containing the wavelength conversion material,
wherein the poly(silphenylene-siloxane) copolymer resin is of the formula:

wherein $R_1$ to $R_7$ are the same or different and are selected from the group consisting of hydrogen atoms, substituted or unsubstituted, saturated or unsaturated, linear, branched or cyclic aliphatic hydrocarbon groups, aromatic hydrocarbon groups, fluorocarbon groups and combinations thereof, wherein $A_2$ is selected from the group consisting of an alkenyl group, an allyl group, an alkoxy group, an alkenoxy group and an aryloxy group, wherein $A_1$ is selected from the group consisting of a hydrogen atom, a hydroxyl group, an alkoxy group, an alkenoxy group, an alkenyl group, an allyl group and an aryloxy group, wherein $A_3$ is one of a hydrogen atom, a linear, branched, cyclic, saturated or unsaturated aliphatic alkyl group, an alkenyl group, an allyl group, an aryl group, or a hydrogensilyl group of the formula $SiZ_2H$, where Z is an alkyl group, an alkenyl group, an aryl group, or a fluorocarbon group, wherein a is an integer ranging from 1 to 3, wherein $0 \leq n \leq 1$, $0 \leq m \leq 1$, and wherein n+m=1.

25. The method of claim 24, wherein $R_1$, $R_2$, $R_3$ and $R_4$ are each hydrogen, $R_5$ and $R_6$ are methyl, $R_7$ is a phenyl group, $A_1$ is a hydroxyl group, $A_2$ is an ethoxy group and $A_3$ is an ethoxy group.

26. The method of claim 24, wherein $R_3$ and $R_4$ are each hydrogen, $R_5$ and $R_6$ are each phenyl groups, $A_1$ is a hydroxyl group and $A_3$ is a hydrogen atom.

* * * * *

UNITED STATES PATENT AND TRADEMARK OFFICE
CERTIFICATE OF CORRECTION

PATENT NO.      : 10,221,353 B2
APPLICATION NO. : 15/116414
DATED           : March 5, 2019
INVENTOR(S)     : Tchoul et al.

Page 1 of 1

It is certified that error appears in the above-identified patent and that said Letters Patent is hereby corrected as shown below:

In the Claims

In Column 19, Lines 5-19, Claim 1, delete the chemical formula and insert

, --.

In Column 20, Lines 1-7, Claim 8, delete the chemical formula and insert

, --.

In Column 21, Lines 52-58, Claim 20, delete the chemical formula and insert

, --.

Signed and Sealed this
Fourteenth Day of May, 2019

Andrei Iancu
*Director of the United States Patent and Trademark Office*